United States Patent
Harrison

(10) Patent No.: US 9,639,636 B1
(45) Date of Patent: May 2, 2017

(54) ALGORITHMICALLY DRIVEN SELECTION OF PARALLELIZATION TECHNIQUE FOR RUNNING MODEL SIMULATION

(71) Applicant: Google Inc., Mountain View, CA (US)

(72) Inventor: Ryan James Harrison, Ontario (CA)

(73) Assignee: Google Inc., Mountain View, CA (US)

( * ) Notice: Subject to any disclaimer, the term of this patent is extended or adjusted under 35 U.S.C. 154(b) by 1002 days.

(21) Appl. No.: 13/796,551

(22) Filed: Mar. 12, 2013

Related U.S. Application Data

(60) Provisional application No. 61/619,119, filed on Apr. 2, 2012.

(51) Int. Cl.
*G06G 7/48* (2006.01)
*G06F 17/50* (2006.01)

(52) U.S. Cl.
CPC ................ *G06F 17/5009* (2013.01)

(58) Field of Classification Search
None
See application file for complete search history.

(56) References Cited

U.S. PATENT DOCUMENTS

| | | | | |
|---|---|---|---|---|
| 5,801,938 A | * | 9/1998 | Kalantery | G06F 17/5009 700/2 |
| 2006/0036426 A1 | * | 2/2006 | Barr | G06F 17/5009 703/22 |
| 2009/0132223 A1 | * | 5/2009 | Supalov | G06F 8/45 703/21 |

FOREIGN PATENT DOCUMENTS

CN 101777007 A * 7/2010

OTHER PUBLICATIONS

Chandran, Priya, et al. "Parallelizing SystemC kernel for fast hardware simulation on SMP machines." Proceedings of the 2009 ACM/IEEE/SCS 23rd Workshop on Principles of Advanced and Distributed Simulation. IEEE Computer Society, 2009.*

* cited by examiner

*Primary Examiner* — Saif Alhija
(74) *Attorney, Agent, or Firm* — Lerner, David, Littenberg, Krumholz & Mentlik, LLP

(57) ABSTRACT

Systems and methods of automating parallelization kernel selection in distributed simulations are discussed herein. Techniques disclosed pertain to attempting execution of all runs or representative run sets on an external simulation kernel and monitoring for failures, with a threshold amount of failures prompting simulation run completion on an internal simulation kernel. Further techniques pertain to performing static analysis on a model simulation job to determine an appropriate simulation kernel.

20 Claims, 5 Drawing Sheets

Inputs
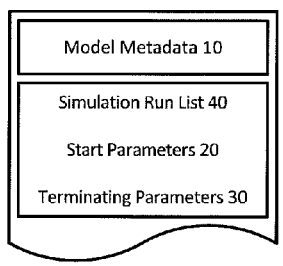
Fig. 1a – Model Simulation Job 90
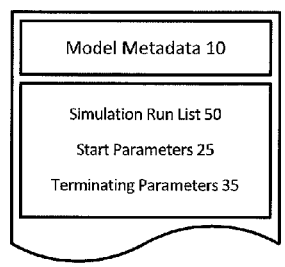
Fig. 1b – Model Simulation Job with Representative Run List 91
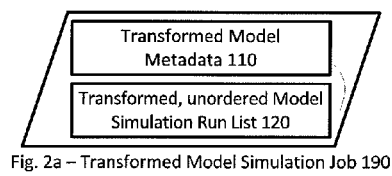
Fig. 2a – Transformed Model Simulation Job 190
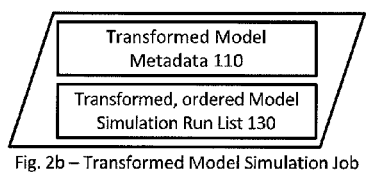
Fig. 2b – Transformed Model Simulation Job with Representative Run List 191
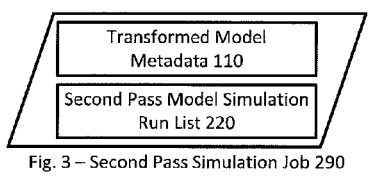
Fig. 3 – Second Pass Simulation Job 290
Output
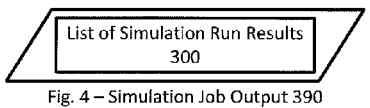
Fig. 4 – Simulation Job Output 390

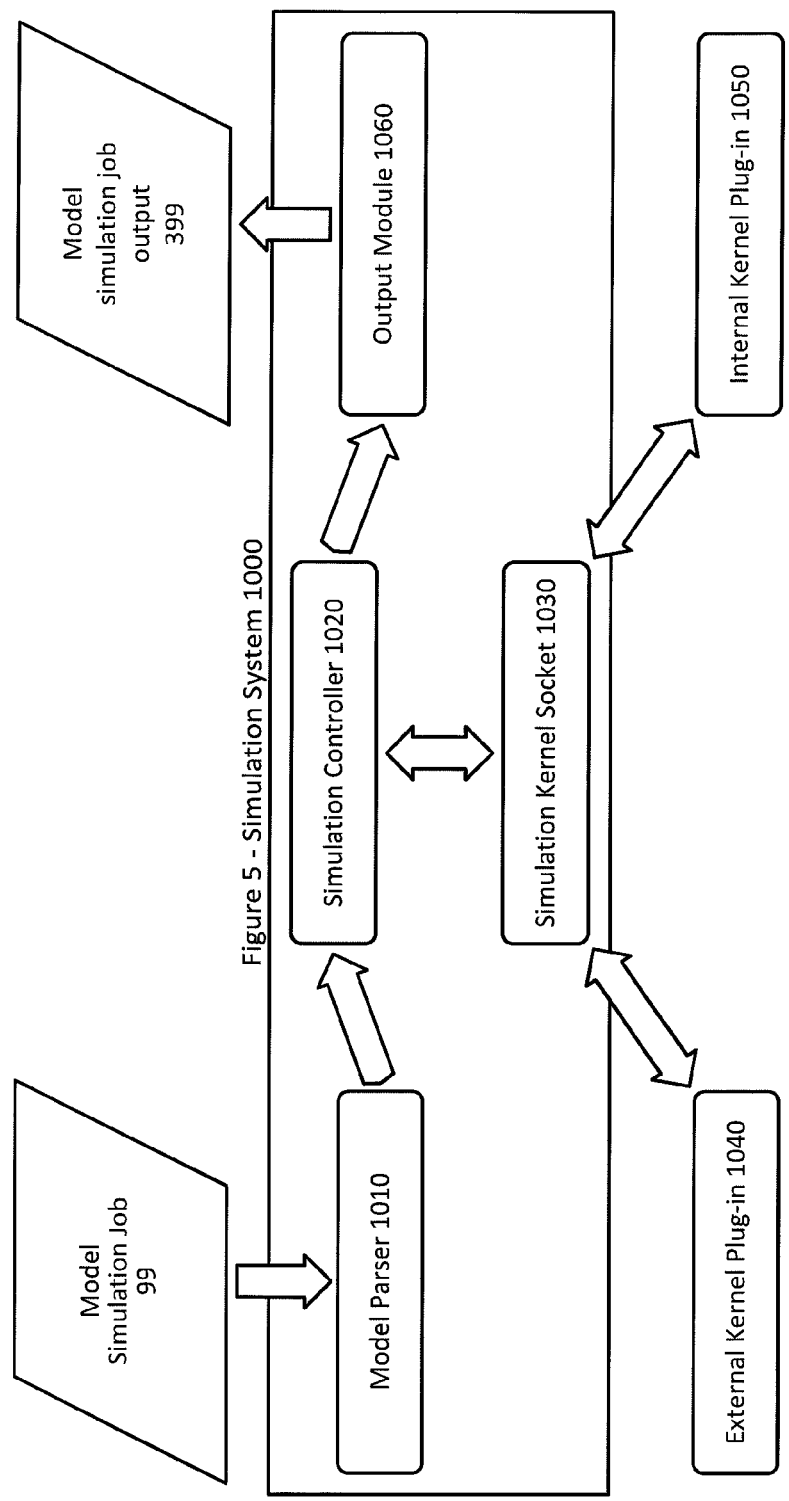

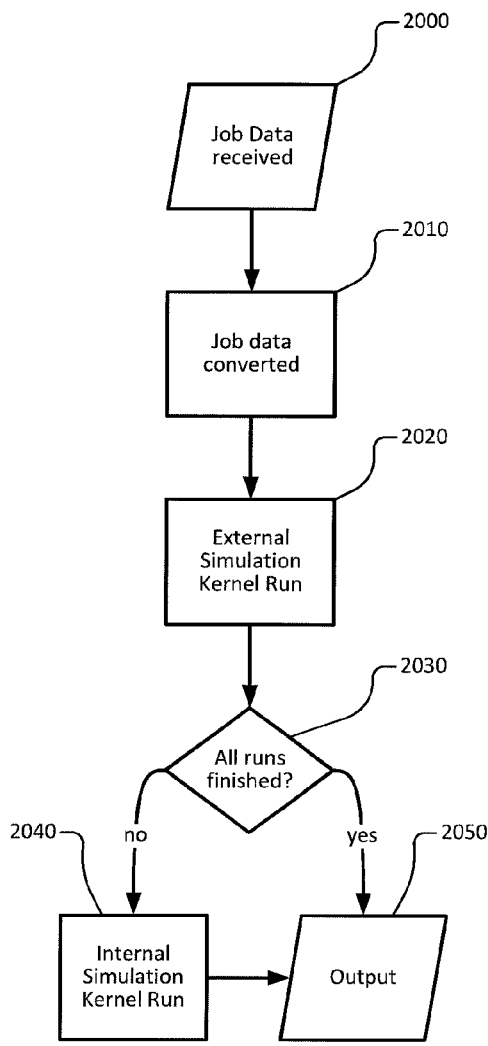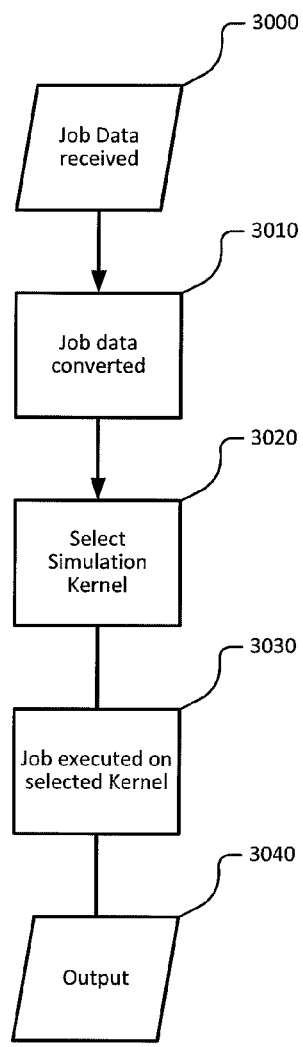
Fig. 6a Flowchart corresponding to Brute Force and Representative Runs Methods
Fig. 6b – Flowchart corresponding to Static Analysis Method (assumed to be performed by the simulation controller, along with the kernel selection)

ALGORITHMICALLY DRIVEN SELECTION OF PARALLELIZATION TECHNIQUE FOR RUNNING MODEL SIMULATION

CROSS-REFERENCE TO RELATED APPLICATIONS

This Nonprovisional application claims priority under 35 U.S.C. §119(e) on U.S. Provisional Application No. 61/619,119 filed on Apr. 2, 2012, the entire contents of which are hereby incorporated by reference.

BACKGROUND

One of two parallelization methods—referred to as internal or external parallelization, depending on type—may be employed when running a distributed simulation. Current simulation implementations tie the parallelization method and model simulation together, allowing for greater efficiencies and faster computation times to be realized when a proper parallelization method is selected for a particular model. However, realizing such efficiencies and faster computation times requires that a parallelization method be chosen in advance of running the simulation.

While a proper choice in the underlying parallelization method can, depending on the model being simulated, significantly reduce its memory consumption and overall run time, an a priori estimate of the optimality of choosing either method is generally computationally prohibitive because it can take as much, or more, time as running the simulation itself.

SUMMARY

Embodiments disclosed herein may pertain to a method for automating parallelization kernel selection in distributed simulations, comprising: receiving data representing a model simulation job; converting the received data into a format suitable for processing; first performing simulation runs of the model simulation job with an external parallelization kernel; determining whether all simulation runs in the model simulation job successfully completed on the external kernel; second performing simulation runs of the model simulation job with an internal kernel responsive to a determination that not all simulation runs in the model simulation job successfully completed on the external kernel; and generating model output data representing results of all simulation runs in the model simulation job.

In some embodiments, converting includes converting the model simulation job into a transformed simulation job, said transformed simulation job having a data format suitable for processing by the external and internal kernels; and forwarding the transformed simulation job to a simulation controller.

In some embodiments, the method further includes connecting to the external parallelization kernel with the simulation controller via a kernel socket; sending the transformed simulation job to the external kernel after said connecting; and disconnecting from said external parallelization kernel after said determining.

In some embodiments, first performing includes: extracting model metadata from the model simulation job; initializing a failed run count counter, a current run instance indicator, and a total run count indicator; external executing a simulation run corresponding to a current run instance; execution determining whether a result of said executing was successful; responsive to a determination that a result of said external executing was successful, providing a result of said executing as simulation run output, otherwise adding information about said simulation run to a failed run list and incrementing the failed run count counter; completion determining whether the current run instance indicator is less than the total run count indicator; responsive to a determination that the current run instance is less than the total run count indicator, incrementing the current run instance indicator and performing said executing, determining, and completion determining steps, otherwise sending the simulation job output to an output module.

In some embodiments, determining whether all simulation runs in the model simulation job successfully completed on the external kernel includes: responsive to a determination that the current run instance is at least equal to the total run count indicator, checking, before said sending the simulation job output to an output module, whether the failed run count counter indicates one or more failed runs; and responsive to a determination that the failed run count counter indicates one or more failed runs, carrying out said second performing step on said failed runs instead of said sending the simulation job output to an output module; responsive to a determination that the current run instance is less than the total run count indicator, checking, before said incrementing the current run instance indicator, whether the failed run count counter is greater than a failed run threshold; and responsive to a determination that the failed run count counter is greater than a failed run threshold, carrying out said second performing step on said failed runs and any remaining model runs instead of said incrementing the current run instance indicator.

In some embodiments, second performing includes: connecting to an internal simulation kernel with a simulation controller; moving any failed or un-processed simulation runs to a failed run list; copying the failed run list to the internal simulation kernel; initializing a current run instance indicator, and a total run count indicator, where said total run count indicator represents a number of simulation runs in the failed run list; internal executing a simulation run corresponding to a current run instance; completion determining whether the current run instance indicator is less than the total run count indicator; responsive to a determination that the current run instance is less than the total run count indicator, incrementing the current run instance indicator and performing said executing and completion determining steps, otherwise sending the simulation job output to an output module and disconnecting the simulation controller from the internal simulation kernel.

Embodiments disclosed herein may pertain to a method for automating parallelization kernel selection in distributed simulations, comprising: receiving, at a model parser, a simulation model and a first simulation run list; converting, by the model parser, the simulation model and first run list to a format consumable by a simulation kernel; passing the converted simulation model and the converted first run list to a simulation controller; loading an external simulation kernel; loading the converted simulation model and converted first run list into the external simulation kernel; initializing a run count and a failed run count; setting a total external run number to a number of simulation runs on the first run list; first running the simulation model using the external simulation kernel; first determining whether said first running resulted in a successful simulation run; responsive to a first determining indicating a successful run, passing an output of said first running to the output module; and responsive to a first determining indicating an unsuccessful run, updating a second run list with parameters from said first running and incrementing the failed run count;

second determining, whether the run count is less than the total external run number; responsive to a second determining indicating that the run count is not less than the total external run number, unloading the external simulation kernel, the converted simulation model, and the converted first run list; and responsive to a second determining indicating that the run count is less than the total external run number; third determining, whether the failed run count is less than a failure threshold; responsive to a third determining indicating that the failed run count is less than the failure threshold, incrementing the run count and performing said first running; first determining, and second determining steps; and responsive to a third determining indicating that the failed run count is not less than the failure threshold, halting the external simulation kernel and loading an internal simulation kernel; updating the second run list with parameters from any not-yet-run simulation runs; re-initializing the run count; setting a total internal run number to a number of simulation runs on the second run list; second running the simulation model using the internal simulation kernel; passing an output of said second running to the output module; fourth determining whether the run count is less than the total internal run number; responsive to a fourth determining indicating that the run count is not less than the total internal run number, unloading the internal simulation kernel, the converted simulation model; and the second run list; and responsive to a fourth determining indicating that the run count is less than the total internal run number, incrementing the run count and performing said second running, passing, and fourth determining steps.

In some embodiments, initializing a run count and a failed run count includes initializing a run count to 1 and a failed run count to 0.

In some embodiments updating a second run list with parameters from said first running further includes removing the parameters from said first running from the first run list.

Embodiments disclosed herein may pertain to a method for automating parallelization kernel selection in distributed simulations, comprising: receiving data representing a model simulation job; converting the received data into a format suitable for processing; selecting a simulation kernel for the model simulation job based on static analysis of the converted received data; executing the model simulation job on the selected simulation kernel; and generating model output data representing results of all simulation runs in the model simulation job.

In some embodiments converting includes: converting the model simulation job into a transformed simulation job, said transformed simulation job having a data format suitable for processing by an external simulation kernel and internal simulation kernel; and forwarding the transformed simulation job to a simulation controller.

In some embodiments, selecting includes: performing said static analysis on the transformed simulation job with the simulation controller; identifying one of the external kernel and the internal kernel as the selected simulation kernel based on said static analysis; and connecting to the selected simulation kernel with the simulation controller.

In some embodiments, executing includes: extracting model metadata from the transformed model simulation job; initializing a current run instance indicator and a total run count indicator, where the total run count indicator represents a number of runs on a run list of the transformed model simulation job; executing a simulation run corresponding to a current run instance; completion determining whether the current run instance indicator is less than the total run count indicator; responsive to a determination that the current run instance is less than the total run count indicator, incrementing the current run instance indicator and performing said executing, and completion determining steps, otherwise sending the simulation job output to an output module.

Further embodiments may pertain to systems including processors and computer-readable media (including non-transitory computer readable media) configured to carry out some or all of the method embodiments described above or to computer-readable media (including non-transitory computer readable media) having instructions embodied thereon meant to cause a processor to carry out some or all of the method embodiments described above.

Further scope of applicability of the systems and methods discussed will become apparent from the detailed description given hereinafter. However, it should be understood that the detailed description and specific examples, while indicating preferred embodiments of the systems and methods, are given by way of illustration only, since various changes and modifications within the spirit and scope of the concepts disclosed herein will become apparent to those skilled in the art from this detailed description.

BRIEF DESCRIPTION OF THE DRAWINGS

The systems and methods discussed will become more fully understood from the detailed description given herein below and the accompanying drawings which are given by way of illustration only, and thus are not limitative, and wherein FIG. 1a depicts an embodiment of a set of data as described herein;

FIG. 1b depicts an embodiment of a set of data as described herein;

FIG. 2a depicts an embodiment of a transformed set of data as described herein;

FIG. 2b depicts an embodiment of a transformed set of data as described herein;

FIG. 3 depicts an embodiment of a second pass set of data as described herein;

FIG. 4 depicts an embodiment of a set of output data as described herein;

FIG. 5 depicts a block diagram of an embodiment of an automatic parallelization mode selecting simulation system as described herein;

FIG. 6a depicts an embodiment of an automatic parallelization mode selecting simulation process as described herein;

FIG. 6b depicts an embodiment of an automatic parallelization mode selecting simulation process as described herein;

Figure 7A:
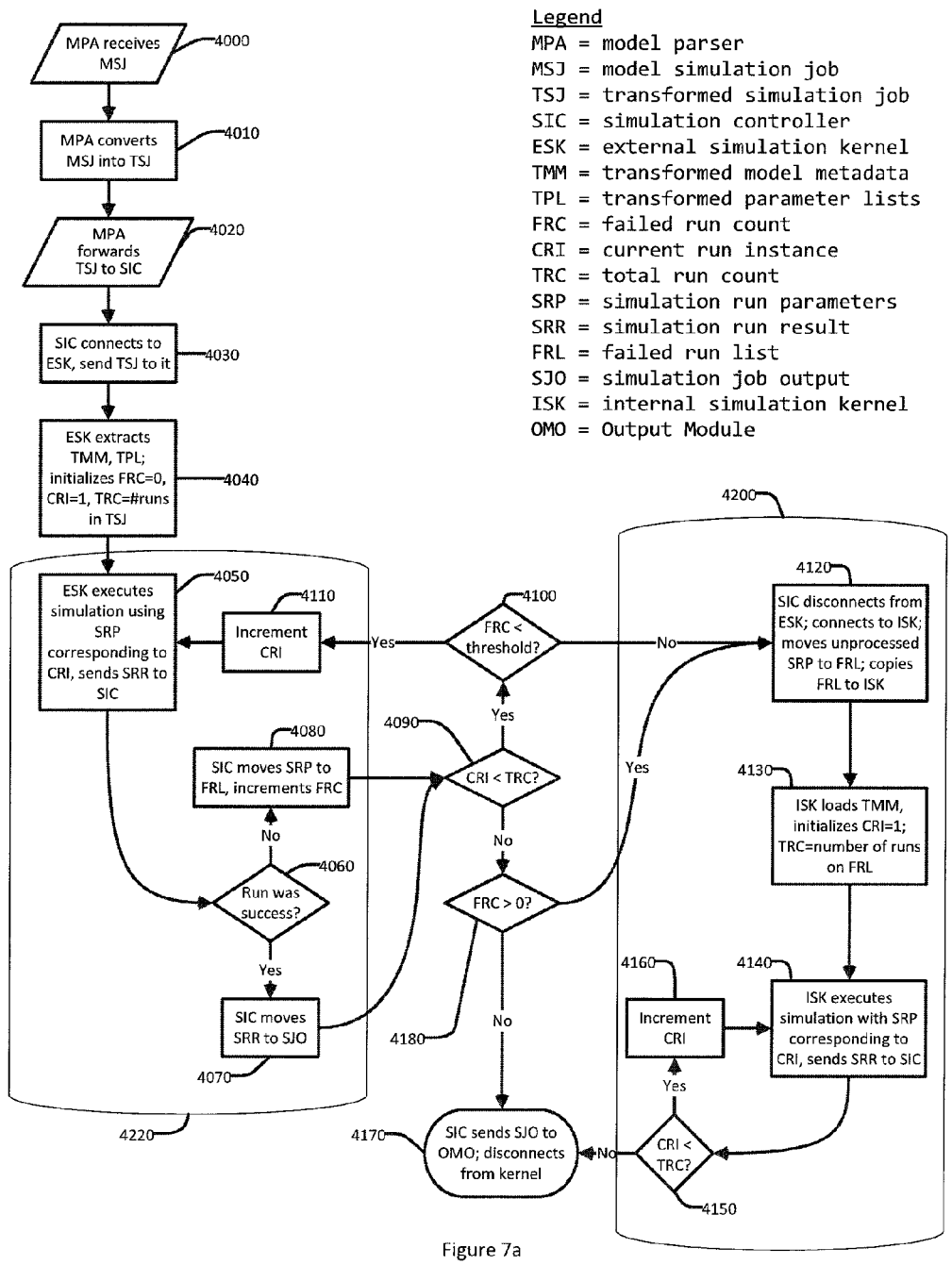
FIG. 7a depicts an embodiment of an automatic parallelization mode selecting simulation process as described herein.

The drawings will be described in detail in the course of the detailed description.

DETAILED DESCRIPTION

The following detailed description refers to the accompanying drawings. The same reference numbers in different drawings identify the same or similar elements. Also, the following detailed description does not limit the concepts discussed. Instead, the scope of the concepts discussed herein is defined by the appended claims and equivalents thereof.

Parallelization mode selection techniques as discussed herein relate to systems and methods for automatically selecting a parallelization mode for model execution without making an a priori evaluation of an optimal parallelization mode. In one embodiment of an automatic parallelization mode selecting simulation system, the system receives a set of data, an embodiment of which is shown in FIG. 1a, from an external entity during the submission of a discrete-event model simulation job 90. The external entity may be a user, a processor, a computing device, a database, or any other hardware, software, or user-controlled system configured to submit model simulation job requests.

In some variations, a model simulation job 90 may be submitted as a data file that may be in a human-readable text format, or a potentially more machine-efficient binary format. The data file representing the model simulation job 90 may include model metadata 10. Variations of model metadata 10 may include data representing models of one or more process-oriented physical systems. The reflexivity and reaction variability of such process-oriented systems in response to a number of state conditions and various external stimuli may be the aspects that are being investigated as part of the simulation job 90.

Variations of such model data sets may be highly variable in set size, as they depend at least in part on the size of the system(s) they model, the range and number of system-related behaviors being investigated, and the complexity of the external stimuli and possible responses thereto. Further factors that may influence model data set sizes include levels of detail in the model that capture underlying system/process characteristics or aspects thereof with sufficient accuracy; and, on a broader level, the actual techniques utilized to conduct the simulations.

Some variations of a model simulation job 90 may call for one or more simulation runs. In some such variations, it may be desired to initialize each simulation run with a set of starting (or state) conditions. In such variations, the data set representing the model simulation job may also include one or more sets of simulation start parameters 20, with each set containing a number of parameters that represent a set of environmental state conditions intended to mimic corresponding states in the simulated system with some predetermined degree of accuracy. Similar to the model metadata 10, the size and number of the parameter set(s) in the simulation start parameters 20 may be proportional to the complexity of the environmental state of the process being modeled, the number of starting conditions being investigated, as well as any additional factor(s) that may be of consequence.

Finally, the data file representing the model simulation job 90 may also provide one or more sets of simulation terminating parameters 30, which define model parameters and associated values that, when reached by the running simulation, indicate that a terminal state has been achieved and that the simulation run pertaining to the concurrent start and stop parameters is to be halted.

Similar to the metadata 10 and start parameters 20, the size and complexity of the simulation terminating parameters 30 may be proportional to the number and complexity of starting state(s) or end state(s) defined for the simulated system(s) or process(es), or any other associated factor(s) or condition(s).

In some variations of model simulation jobs, the start parameters 20 and terminating parameters 30 may be provided by means of simulation run lists, comprising one or more entries with start parameter and terminating parameter pairs. Such variations establish a variety of predetermined mappings between initial conditions and terminating conditions. Variations may include one-to-one, one-to-many, many-to-one, many-to-many, or combinatorial mappings between simulation job start and terminating parameters.

Variations of such lists may be organized in accordance with requirements set forth by simulation execution strategies whose objectives may include workflow maximization using multi-factor optimization techniques that account for such issues as computational resource allocation, failed simulation run incident rate, as well as any other factors that may inhibit or adversely affect the processing of data.

Variations of such run list organizational strategies may include simple reliance on kernel performance advantages producing such high levels of processing improvement that even in cases of failed runs, merely switching to the more optimal simulation kernel and restarting the simulation run still provides significant advantages over finishing the simulation run on the simulation kernel that was chosen at the beginning of the job. Consequently, such variations may contain model simulation run lists 40 comprising start 20 and terminating 30 parameter pairs that are not ordered in any particular way.

Other variations of run list ordering strategies may attempt to minimize the incidence rate of sub-optimal kernel utilization by selecting a number of simulation runs whose collective runtime behaviors are, within given error bounds, relatively representative for the entire set of runs and can thus be used for a priori decisions regarding what kernel to load prior to each model simulation job. A variation of a model simulation job using such representative runs is shown in FIG. 1b.

Such variations may maintain a simulation run list 50 comprising start 25 and terminating 35 parameter pairs as previously described, but with the simulation run list 50 organized in a fashion so that representative runs are executed first. In some such variations, the simulation start parameters 25 and terminating parameters 35 may be ordered in a sequence based on a desired execution sequence for the representative runs. In other variations, the start and terminating parameters 25, 35 may not vary in sequence and only the sequence of run on the run list 50 may be changed.

Some variations of simulation job algorithms and corresponding set sizes and arrangements of basis functions are depicted in FIGS. 6a,b. Variations thereof may comprise basis function set sizes and arrangements as depicted in FIG. 6a, corresponding to simulation jobs that may utilize sequential computation methods, trial-and-error methods, or methods involving representative runs. Other variations may comprise set sizes and arrangements as depicted in FIG. 6b, corresponding to simulation jobs whose run results may be predicated on an availability of statically analyzed model simulation data.

Some variations of simulation systems may receive (2000, 3000) model simulation jobs as a set of data over a network connection, delivered via (a) potentially portable hard drive(s), solid state memory, or any other form of storage media; or by means of electronic, or any other transmission medium.

Variations of simulation systems may forward the simulation jobs to model parsers that may perform one or more conversions on said simulation jobs (2010, 3010). Variations of such conversions may include methods or techniques that format or convert unorganized data into canonical forms that are readily consumable by downstream system components.

Variations of unorganized data may include data whose organizational structure may deviate from a canonical model simulation job input data format. Other variations of such data may comprise numeric data in alternate architectural formats (big endian, where little endian is required and vise versa), differing data types (integer/floating point; signed/unsigned integer; or number(s) of bits used for said representations), differing base representations (binary/octal/decimal), transmission-based, or other sources of error, or any other number or combination of said factors.

Other variations of data format conversion techniques may include any number of stochastic or deterministic techniques and may manage changes due to variances in physical media, as well as changes due to lossy, or non-lossy data compression methods.

A variation of an automatic parallelization mode selecting simulation system is depicted in FIG. 5. After initial delivery to the system, a model simulation job 99 is forwarded to a model parser 1010, which fulfills one or more tasks related to preparing the data representing the model simulation job 99 for downstream processing and execution.

In some variations, the model parser may convert the incoming model simulation job metadata 10 and associated parameter data sets to meet one or more input requirements of components located downstream in the simulation system chain. Such downstream components may include, for example, a simulation controller and any associated simulation kernels, kernel sockets, or output modules.

Such variations of a model parser may be implemented as one or more hardware components (which would generally increase throughput), software components (which would favor flexibility and expandability), or as a hardware-software hybrid (which would retain advantages of the other two implementations).

The model parser may take, as its input, the model metadata 10 and start/terminating parameter sets. Based on the input requirements of the downstream component(s), the parser may reorganize and convert this data and, in some variations, further convert the data representing the model simulation job 99 into a binary or internal representation.

Variations of a model parser may also fulfill additional functions as well, such as performing simple range boundary checks to enforce incoming data integrity or validity requirements at a rudimentary level; moderating model system data corruption by providing error detection and correction for incoming metadata and parameter sets; or adding flexibility in input handling via multi-format model simulation input recognition and conversion to said required internal representation.

FIG. 2a shows an embodiment of a transformed model simulation job 190, which may be a reorganized (transformed), binary representation of the initial/input model simulation job 90. In some variations, the transformed model simulation job 190 may be quantitatively equivalent to the data set representing the model simulation job 90.

The transformed simulation job may contain transformed versions of the model metadata 110, and simulation run list 120. These data sets may be binary representations of the corresponding portions of the data representing the model simulation job 90, organized to adhere to format requirements of simulation system components. A model simulation job variation using representative run technique(s) 191 may include a transformed version of an ordered simulation run list 130, as shown in FIG. 2b.

Once the model parser 1010 has converted and restructured the original model simulation job into a transformed simulation job, it may subsequently forward this information to a simulation controller 1020.

In some variations, the simulation controller 1020 and other downstream components may be configured to expect incoming data to be in one or more pre-defined formats. This may be done in order to minimize memory usage and communication latency while maximizing communication processing and transfer speeds. Variations of a model parser 1010 may be employed to address such pre-defined data format variations. Other variations, where such pre-defined data format rules are not utilized, may omit or remove the parser or integrate part or all of any required parser or parser-like functionality into the simulation controller or a simulation kernel.

In some variations, the simulation system 1000 may be realized, in whole or in part, as an executable program that links to shared object libraries to fulfill most of its functionality while minimizing its footprint. Such a program may be executed in whole or in part by one or more processors or computers and may be stored or otherwise embodied in one or more computer-readable or processor-readable memories or storage media.

In such executable program variations, the simulation kernels may exist in the form of shared objects that are loaded by the simulation system 1000 at run-time and communicate with the simulation controller 1020 by means of one or more real or virtual communication interfaces or interface protocols, such as uniform application programming interfaces (APIs). Variations of such APIs may incorporate locking mechanisms or other access control methods that restrict the simulation controller 1020 to communicating with a single simulation kernel at a time. Some such variations may implement the restrictions through the use of simulation kernel sockets 1030, which grant the simulation controller 1020 implicit access to a number of disparate components, while restricting connectivity to one such device at a time.

In other variations, both the simulation system 1000 and the simulation kernels 1040, 1050 may be functional components located within a single, monolithic executable file or program. Further variations thereof may include any number of such additional files or programs, including files from other related or unrelated systems.

In some variations, after the simulation controller 1020 receives the transformed simulation model run data 190, 191 from the parser 1010, it assumes control of remaining simulation system activities. In such a variation, before each model simulation run, the simulation controller 1020 may decide whether the run should be conducted using an external simulation kernel 1040 or an internal simulation kernel 1050. Such a decision may be made based on system resource constraints and simulation run parameters.

External 1040 and internal 1050 simulation kernels differ in how they use the parallelism of an underlying hardware infrastructure to execute the model simulation job. External kernels 1040 exhibit a linear, one-to-one relationship between the number of available computational units and the number of concurrently running model simulation runs; therefore, loading additional external kernel instances in order to execute more simulation runs increases processing speed in a linear fashion.

Unlike with external kernels where simulation runs can be executed in their entirety on individual kernels, in the case of internal kernels 1050, multiple computing nodes need to pool their memory and computational resources to perform each individual simulation run. The amount of speed increase gained from doing this is limited by the linear increase in speed/reduction in time that an external kernel variation can provide, since there is some execution latency and communication overhead associated with this mode of operation.

In some variations, the external simulation kernel 1040 can be used when the maximum memory footprint of each run of a transformed simulation job is allocable within the physical memory confines of all computing resources (such as, for instance, nodes in a clustered environment) participating in the current model simulation job. Since individual model simulation runs are statistically independent, it is possible to execute as many individual simulation runs concurrently as the number of allocable computing resources allows.

In contrast to this, selection of the internal simulation kernel is based on the assumption that the memory footprint of at least one run from a transformed simulation job exceeds the maximum amount allocable by all participating computing resources and hence the transformed simulation job has to be distributed across a number of participating resources.

Consequently, whereas the external simulation kernel is able to execute a plurality of model simulation runs concurrently, the internal simulation kernel dedicates a plurality of computing resources per run. In some variations of model simulation jobs or simulation runs, the internal kernel may only be able to execute a single run at one time. In addition, when a model simulation run is distributed across a plurality of computing resources that execute it simultaneously, issues such as data parallelism and process concurrency have to be managed, which may additionally reduce computational efficiency compared to the data processing method utilized by the external kernel.

However, because the internal simulation kernel dedicates the combined memory resources of two or more computational resources to each run, it typically does not run out of physical system memory in the course of any given run. In variations where memory exception do occur during a run involving the external simulation kernel, the computational resource must either end the run and report an out-of-memory condition; or it must compensate by swapping portions of the transformed model data to an extended memory segment, such as a hard disk, which may significantly hinder computational efficiency and effectively disqualify the external kernel from future use within the current simulation job. In such situations, the simulation run may be subsequently rescheduled to be run on the internal simulation.

The simulation system 1000, given the constraints related to internal 1050 and external 1040 kernels, must make a selection a priori regarding the appropriate kernel to use for a given model simulation job 99. This is a non-trivial task in simulation systems configured to maximize the utility of the external kernel due to its inherent performance advantage, while minimizing the number of failed runs involving said kernel.

One variation of a simulation system 1000 resolves this selection problem in part by noting that for a model simulation run that executes within the bounds of the system's memory limits, its performance rate is a multiple of that of the internal simulation kernel. Such a variation of a simulation system 1000 may therefore be configured to adopt a model simulation run strategy whereby the simulation controller 1020 executes all simulation runs on the external kernel 1040 first and tracks the simulation run instances and number that result in an out-of-memory condition.

In some variations, after each failure, the transformed simulation run list 120 entry corresponding to the failed run may be moved to a second pass run list 220 of a second-pass model simulation job 290 (a variation of such a list is shown in FIG. 3). Some variations of the second pass run list 220 may also receive a copy of the transformed model metadata 110 from the transformed simulation job data 190 generated by the model parser 1010.

In some variations, when the number of failed external kernel simulation runs reaches a pre-defined threshold, all remaining jobs in the simulation run list may be moved to the second pass run list 220. When that pre-defined threshold is reached, the simulation controller 1020 unloads, or disconnects from the external kernel 1040, loads or connects to the internal kernel 1050, and begins processing the simulation runs contained in the second pass run list 220 of the second pass simulation job 290. Such a variation is discussed in more detail with respect to FIG. 6a.

In some variations, the second pass simulation job 290 may be omitted. Instead, a subset of representative simulation runs may be selected from the transformed, unordered model simulation run list 120 and moved to the beginning of the list, forming the transformed, ordered model simulation run list 130 of the transformed model simulation job with representative run list 191, simulation start parameter sets to form simulation start parameter sets with representative run sets 25 and terminal parameter sets with representative run sets 35 (as well as their transformed counterparts 130).

This set of representative simulation runs 130 may then be executed on the external kernel 1040. If all runs from the representative set complete without failure, remaining runs belonging to that simulation model job are subsequently also sent to and executed by the external kernel. However, if any one of the simulation runs belonging to the representative set fails to complete, the simulation controller 1020 disconnects the kernel socket 1030 from the external kernel 1040, connects to the internal kernel 1050, moves all remaining simulation runs to the internal kernel, and resumes the model simulation job using the internal kernel. Such a variation is discussed in more detail with respect to FIG. 6a.

In some variations, the representative runs may be selected by taking a random sampling of model simulation runs from a model simulation run list. In other variations, some pre-run analysis may be performed to select sample runs expected to have the largest memory requirements. Such analysis, which may be performed by the parser 1010 or the simulation controller 1020 in some variations, does not need to have a precise or even especially accurate estimate of memory requirements. In some variations, only an approximate order of magnitude (e.g. on the order of hundreds of megabytes vs. on the order of tens of gigabytes) may be required.

Yet other variations may attempt to estimate a priori the maximum amount of memory that a simulation model job may use during any given simulation run. In some variations, this estimation may be performed by calculating a total amount of memory used by all parameters of the model and adding the start and terminating parameters along with an upper bound on memory that is likely to be needed at any point while executing the model simulation job. Such variations are discussed in more detail with respect to FIG. 6b.

Results from one or more simulation run may be sent back to the simulation controller 1020 by the active simulation kernel via the kernel socket 1030, either during simulation execution or after all simulation runs complete. By the time the model simulation job is completed in its entirety and irrespective of the simulation kernel(s) used, the simulation controller 1020 has received outputs from participating kernels for all simulation runs belonging to that job. The simulation controller may then send the simulation output data to an output module 1060, which may compile all output data into one or more set(s) of simulation model output 399 and, in some variations, optionally perform some form of data conversion similar to the data transformation performed by the parser 1010. In some variations, the output data may include a list of simulation run results 300 which may be written into a simulation job output file 390, a variation of which is shown in FIG. 4, to be returned to the submitter, initiator, or owner of the simulation job.

In some variations, the simulation job output file 390 may be a plain text file, an XML-formatted file, a file containing a spreadsheet or ordered list in an open or proprietary document format, or any other format that may be used to store and meaningfully present the simulation output data.

A variation of a simulation job submission and automatic parallelization kernel selection process is shown in FIG. 6a. The variation shown in FIG. 6a relates to scenarios where processing on an external kernel is always attempted before failing over to an internal kernel. This may include the unordered simulation run list discussed above as well as the representative run variation discussed above.

In the variation shown, a simulation system receives 2000 a model simulation job submitted for execution. As described previously, the system may convert 2010 the simulation job into a transformed simulation job having a data format consistent with one or more of the fixed data formats expected by downstream execution and processing components and begin an external kernel simulation run 2020. As noted above, some simulation system variations may omit the conversion 2010 portion and proceed from job receipt 2000 directly to external kernel execution 2020. The external kernel execution 2020 may be monitored to determine whether all the simulation runs have successfully finished on the external kernel 2030.

In variations using a representative run list to determine an appropriate kernel, this monitoring may be performed only on the representative run list and look for a condition where any one run indicates failure. In variations that do not use a representative run list, the monitoring may look for a threshold amount of run failures which may be greater than one. This threshold may be a set number, a percentage of total runs, or some other statistic indicating a model output data generation rate or quality level. In both representative run and general cases, if all the runs finish successfully on the external kernel 2030, the model data is output 2050 as discussed above. Otherwise, the simulation controller switches to the internal kernel 2040 which completes the remaining and/or failed simulation runs as discussed above. The model data is then output 2050.

Another variation of a simulation job submission and automatic parallelization kernel selection process is shown in FIG. 6b. The variation shown in FIG. 6b relates to scenarios where an a priori estimate or some form of static analysis is performed to select an appropriate parallelization kernel before model execution begins.

In the variation shown, a simulation system receives 3000 a model simulation job submitted for execution. As described previously, the system may convert 3010 the simulation job into a transformed simulation job having a data format consistent with one or more of the fixed data formats expected by downstream execution and processing components. The system may then select an appropriate kernel 3020 for execution of the simulation job based on a priori estimates of likely memory consumption or other forms of static analysis. The received simulation job is then executed on the selected kernel 3030 and the results are output 3040. An advantage in such a variation is that a kernel is selected in advance of execution, allowing for more potential optimizations to be realized during run-time based on kernel selection. However, depending on simulation job complexity, these gains may be fully or partially eliminated due to the up-front computational cost of performing the static analysis.

A variation of a simulation job submission and automatic parallelization kernel selection process is shown in FIG. 7a. The variation shown in FIG. 7a relates to scenarios where processing via an external kernel is always attempted before failing over to an internal kernel. This may include the general case involving an unordered run list discussed above as well as the variation involving a run list sorted by representative runs discussed above.

In the variation shown, a model parser receives a model simulation job 4000 submitted for execution. As discussed above, the model parser may convert the simulation job 4010 into a transformed simulation job having a data format consistent with one or more fixed data formats expected by downstream components. The parser may then forward 4020 the transformed simulation job to the simulation controller.

In the variation shown in FIG. 7a, the simulation controller connects to the external simulation kernel and sends the transformed simulation job to the external kernel 4030. The external kernel extracts the transformed model metadata and parameter lists from the transformed simulation job and initializes run-monitoring parameters 4040. The run-monitoring parameters may include a count of failed simulation runs, a value representing the current run instance, and a total run count. The count of failed simulation runs may be initialized to zero or some other zero-indicative value as no simulation has yet been run. In some variations, the count of failed simulations may be replaced with a count of expected successful simulations set at the total run count and decremented as simulation runs fail. The count of particular run instances may be initialized to either a zero state or an initial run state indicating an impending simulation run attempt. In some variations, the count of particular run instances may be initialized to the total run count and decremented as simulation runs are attempted. In other variations, the count of particular run instances may be used as a pointer into the run list instead of an actual count of total run attempts. In such variations, the run instance count may indicate a particular place on the run list and not necessarily an actual count of runs attempted.

Once the monitoring parameters are initialized, the external kernel simulation run sequence is started 4220. The external kernel runs the simulation based on the simulation run parameters, starting with an initial simulation run, and sends the simulation run result to the simulation controller 4050. After a simulation run is attempted, it is analyzed to determine whether the run was successful 4060. In some variations, the kernel will emit an exit code that will indicate if it is exiting due to reaching a simulation run termination condition or due to an error. In such variations, monitoring this exit code will allow for a determination of whether or not a run was successful.

In the event of a successful simulation run, the simulation controller sends the simulation run result to a file or output staging area for simulation job output 4070. In the event of a failed simulation run, the simulation run parameters for the failed run are moved to a failed run list that stores failed simulation run information and the failed run count in incremented or otherwise adjusted to indicate a failed run 4080.

After the simulation run is completed and evaluated, a check is performed by the simulation controller to see if the count of run instances has reached the total run count 4090. If the total run count has been reached and there are no failed runs 4180, the simulation run process is concluded. The simulation controller sends the simulation job output to the output module, which may re-transform the simulation job output into a format requested or suitable for output back to the simulation requesting entity 4170. At that time, the simulation controller also disconnects from, or unloads the simulation kernel.

If the total run count has not been reached a check is performed to see if a threshold number of failed runs has been reached 4100. The threshold of failed runs may be a pre-set, dynamically determined, or user-provided limit on the number of failed simulation runs. When the failed simulation run threshold is reached, the simulation execution process stops the external kernel simulation run sequence 4220 and proceeds to the internal kernel simulation run sequence 4200. Also, if the total run count has been reached but there are failed runs, the simulation execution process proceeds to the internal kernel simulation run process 4200.

If the failed simulation run threshold is not reached, the current run instance count is incremented 4110 or otherwise adjusted to indicate another simulation run commencing and a subsequent simulation run is executed by the external kernel 4050.

Although shown as a sequential process, the external simulation run sequence 4220 may realize efficiencies through parallelization. In such a variation, multiple simulation instances may be run on external kernels simultaneously with the individual outputs and simulation outcomes being aggregated and managed using techniques such as, for example, standard batch processing. In such variations, a failure threshold may be exceeded due to parallel execution causing multiple simultaneous run failures. Such overshooting of a failure threshold is acceptable in such variations where the failed runs are nonetheless re-executed on the internal kernel.

The internal kernel simulation run sequence 4200 begins with the simulation controller disconnecting from the external simulation kernel and connecting to the internal simulation kernel 4120 and then moving any remaining un-processed simulation run parameters to the failed run list. This failed run list is then copied to the internal simulation kernel. The internal simulation kernel then loads the transformed model metadata, initializes a count of current run instances, and sets the total run count to represent the number of runs on the failed run list 4130. The internal kernel then sequentially executes the simulation runs from the failed run list and sends the result of each simulation run to the simulation controller 4140. After each simulation run, a check is performed to determine if all the simulation runs have been processed 4150. If not, the run instance count is incremented 4160 and the next simulation run is executed 4140. When the total run count is reached 4150, the simulation controller sends the simulation job output to the output module, which may re-transform the simulation job output into a format requested or suitable for output back to the simulation requesting entity 4170.

The variation shown in FIG. 7a is applicable to both the general case and the representative-run case discussed above. In a representative run scenario, the representative runs are passed into the external simulation run sequence 4220 and the failure threshold is one. The remaining runs in the simulation run list may then be executed entirely on the external kernel if the failure threshold is not met, and entirely on the internal kernel if the failure threshold is met.

Figure 7B:
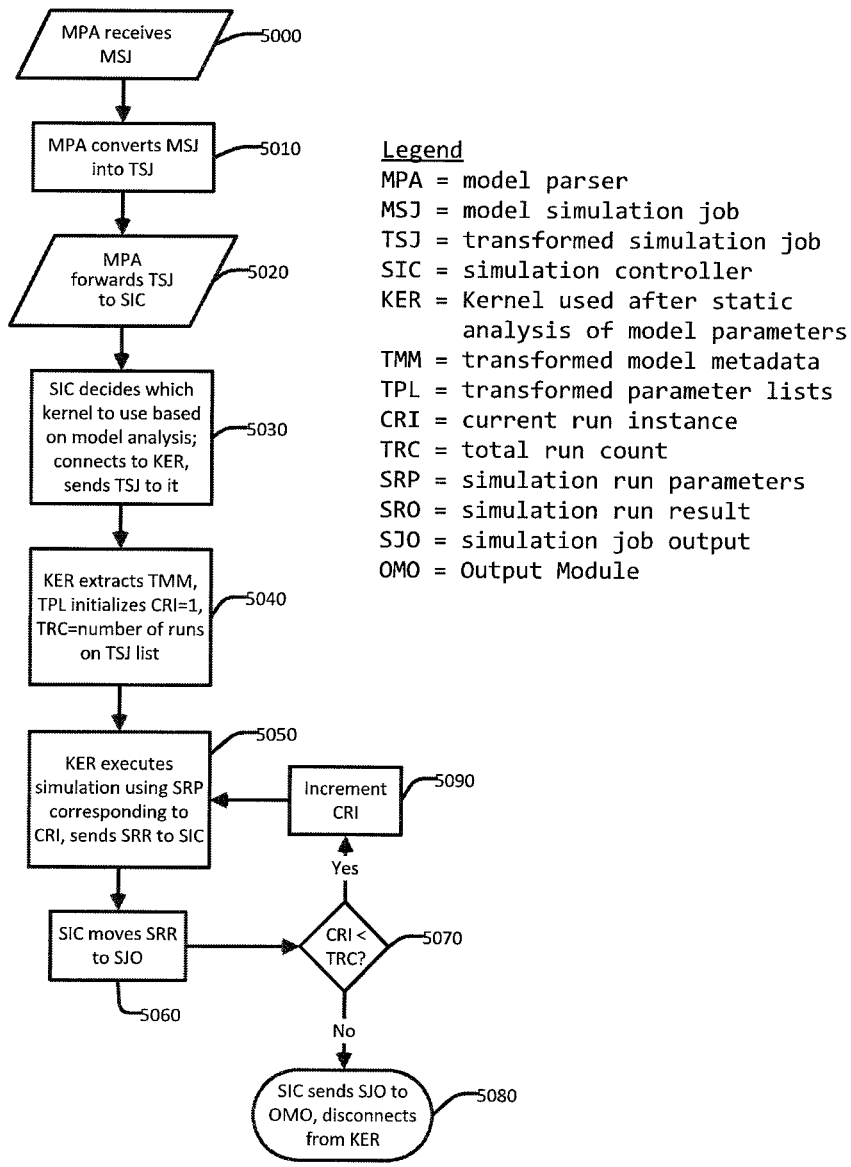
FIG. 7b depicts an embodiment of an automatic parallelization mode selecting simulation process as described herein.

Another variation of a simulation job submission and automatic parallelization kernel selection process is shown in FIG. 7b. The variation shown in FIG. 7b relates to scenarios where an a priori estimate or some form of static analysis is performed to select an appropriate simulation kernel before model execution begins.

In the variation shown, a model parser receives a model simulation job 5000 submitted for execution. As discussed above, the model parser may convert the simulation job 5010 into a transformed simulation job having a data format consistent with one or more fixed data formats expected by downstream components. The parser may then forward 5020 the transformed simulation job to the simulation controller.

In the variation shown, the simulation controller may then decide which kernel to use based on some form of static analysis. Such static analysis techniques may include precise or approximate measures of expected memory consumption. Based on an outcome of the static analysis, the simulation controller may select a particular kernel and send the transformed simulation job to that kernel 5030. As in the previously described variation, the kernel may be internal or external.

The simulation kernel extracts the transformed model metadata and parameter lists from the transformed simulation job and initializes run-monitoring parameters 5040. The run-monitoring parameters may include count of particular run instances and a total run count.

After initialization, the simulation kernel begins executing the simulation runs based on the run parameters 5050. In variations employing an external kernel, parallelization techniques may be employed to conduct multiple simulation runs at once. Variations using an internal kernel may also realize parallelization benefits depending on the number of system nodes required per simulation run.

Once a simulation run is executed, the simulation run results are sent to the simulation job output 5060. If the total run count has not yet elapsed 5070, the current run instance is incremented and the next simulation run is executed. If the total run count has elapsed 5070 the simulation controller sends the simulation job output to the output module and disconnects from the kernel 5080, ending the simulation run sequence.

In some variations, it may occur that the a-prior estimates or other up-front calculations are inaccurate. In such variations, a simulation run failure may still occur. In some variations, such a run failure may cause the system to fail entirely and alert the user of the issue. In other variations, where the a-priori estimate indicates an external kernel is appropriate, the system may employ the previously-discussed logical flow of falling back on the internal kernel in the event of run failure.

Only exemplary embodiments of the systems and solutions discussed herein are shown and described in the present disclosure. It is to be understood that the systems and solutions discussed herein are capable of use in various other combinations and environments and are capable of changes or modifications within the scope of the concepts as expressed herein. Some variations may be embodied in combinations of hardware, firmware, and/or software. Some variations may be embodied at least in part on computer-readable storage media such as memory chips, hard drives, flash memory, optical storage media, or as fully or partially compiled programs suitable for transmission to/download by/installation on various hardware devices and/or combinations/collections of hardware devices. Such variations are not to be regarded as departure from the spirit and scope of the systems and solutions discussed herein, and all such modifications as would be obvious to one skilled in the art are intended to be included within the scope of the following claims:

What is claimed is:

1. A method for automating parallelization kernel selection in distributed simulations, comprising:
 receiving, by one or more processors, data representing a model simulation job;
 converting, by the one or more processors, the received data into a format suitable for processing;
 first performing, by the one or more processors, simulation runs of the model simulation job with an external parallelization kernel;
 determining, by the one or more processors, whether all simulation runs in the model simulation job successfully completed on the external kernel;
 second performing, by the one or more processors, simulation runs of the model simulation job with an internal kernel responsive to a determination that not all simulation runs in the model simulation job successfully completed on the external kernel;
 generating, by the one or more processors, model output data representing results of all simulation runs in the model simulation job; and
 selecting the external kernel or the internal kernel based on the model output data.

2. The method of claim 1, said converting comprising:
 converting the model simulation job into a transformed simulation job, said transformed simulation job having a data format suitable for processing by the external and internal kernels; and
 forwarding the transformed simulation job to a simulation controller.

3. The method of claim 2, the method further comprising:
 connecting the simulation controller to the external parallelization kernel via a kernel socket;
 sending the transformed simulation job to the external kernel after said connecting;
 disconnecting the simulation controller from said external parallelization kernel after said determining; and
 outputting the model output data.

4. The method of claim 1, where said first performing includes:
 extracting model metadata from the model simulation job;
 initializing a failed run count counter, a current run instance indicator, and a total run count indicator;
 executing an external simulation run corresponding to a current run instance;
 determining an execution result based on whether a result of said executing was successful;
 responsive to a determination that a result of said executing was successful, providing a result of said executing as simulation run output, otherwise adding information about said simulation run to a failed run list and incrementing the failed run count counter;
 determining a completion result based on whether the current run instance indicator is less than the total run count indicator;
 responsive to a determination that the current run instance is less than the total run count indicator, incrementing the current run instance indicator and performing said executing, said determining an execution result, and determining a completion result steps, otherwise sending the simulation job output to an output module.

5. The method of claim 4, said determining whether all simulation runs in the model simulation job successfully completed on the external kernel including:
 responsive to a determination that the current run instance is at least equal to the total run count indicator, checking, before said sending the simulation job output to an output module, whether the failed run count counter indicates one or more failed runs; and
 responsive to a determination that the failed run count counter indicates one or more failed runs, carrying out said second performing step on said failed runs instead of said sending the simulation job output to an output module;
 responsive to a determination that the current run instance is less than the total run count indicator, checking, before said incrementing the current run instance indicator, whether the failed run count counter is greater than a failed run threshold; and
 responsive to a determination that the failed run count counter is greater than a failed run threshold, carrying out said second performing step on said failed runs and any remaining model runs instead of said incrementing the current run instance indicator.

6. The method of claim 1, said second performing including:
 connecting to an internal simulation kernel with a simulation controller;
 moving any failed or un-processed simulation runs to a failed run list;
 copying the failed run list to the internal simulation kernel;
 initializing a current run instance indicator, and a total run count indicator, where said total run count indicator represents a number of simulation runs in the failed run list;
 executing an internal simulation run corresponding to a current run instance;
 determining a completion result based on whether the current run instance indicator is less than the total run count indicator;
 responsive to a determination that the current run instance is less than the total run count indicator, incrementing the current run instance indicator and performing said executing an internal simulation run and determining a completion result steps, otherwise sending the simulation job output to an output module and disconnecting the simulation controller from the internal simulation kernel.

7. A method for automating parallelization kernel selection in distributed simulations, comprising:
 receiving, by one or more processors, at a model parser a simulation model and a first simulation run list;
 converting, by the model parser, the simulation model and first run list to a format consumable by a simulation kernel;
 initializing a run count and a failed run count;
 setting, by the one or more processors, a total external run number to a number of simulation runs on the first run list;
 first running, by the one or more processors, the simulation model using an external simulation kernel;
 first determining, by the one or more processors, whether said first running resulted in a successful simulation run;

responsive to a first determining indicating a successful run, passing an output of said first running to the output module, by the one or more processors; and responsive to a first determining indicating an unsuccessful run, updating, by the one or more processors, a second run list with parameters from said first running and incrementing the failed run count;

second determining, by the one or more processors, whether the run count is less than the total external run number;

responsive to a second determining indicating that the run count is not less than the total external run number, unloading, by the one or more processors, the external simulation kernel, the converted simulation model, and the converted first run list; and responsive to a second determining indicating that the run count is less than the total external run number third determining, by the one or more processors, whether the failed run count is less than a failure threshold;

responsive to a third determining indicating that the failed run count is less than the failure threshold, incrementing, by the one or more processors, the run count and performing said first running, first determining, and second determining steps; and responsive to a third determining indicating that the failed run count is not less than the failure threshold, halting, by the one or more processors, the external simulation kernel and loading an internal simulation kernel;

updating, by the one or more processors, the second run list with parameters from any not-yet-run simulation runs;

re-initializing, by the one or more processors, the run count;

setting, by the one or more processors, a total internal run number to a number of simulation runs on the second run list;

second running, by the one or more processors, the simulation model using the internal simulation kernel;

passing, by the one or more processors, an output of said second running to the output module;

fourth determining, by the one or more processors, whether the run count is less than the total internal run number;

responsive to a fourth determining indicating that the run count is not less than the total internal run number, unloading, by the one or more processors, the internal simulation kernel, the converted simulation model, and the second run list; and responsive to a fourth determining, indicating, by the one or more processors, that the run count is less than the total internal run number, incrementing the run count and performing said second running, passing, and fourth determining steps;

generating, by the one or more processors, model output data representing results of all simulation runs in the model simulation job; and selecting the external kernel or the internal kernel based on the model output data.

8. The method of claim 7, where said initializing a run count and a failed run count includes initializing a run count to 1 and a failed run count to 0.

9. The method of claim 7, where said updating a second run list with parameters from said first running further includes removing the parameters from said first running from the first run list.

10. A method for automating parallelization kernel selection in distributed simulations, comprising:

receiving, by one or more processors, data representing a model simulation job;

converting, by the one or more processors, the received data into a format suitable for processing;

selecting, by the one or more processors, an external simulation kernel or internal simulation kernel for the model simulation job based on static analysis of the converted received data;

executing, by the one or more processors, the model simulation job on the selected simulation kernel;

generating, by the one or more processors, model output data representing results of all simulation runs in the model simulation job; and selecting the external kernel or the internal kernel based on the model output data.

11. The method of claim 10, said converting comprising:

converting the model simulation job into a transformed simulation job, said transformed simulation job having a data format suitable for processing by the external simulation kernel and internal simulation kernel; and forwarding the transformed simulation job to a simulation controller.

12. The method of claim 11, said selecting including:

performing said static analysis on the transformed simulation job with the simulation controller;

identifying one of the external kernel and the internal kernel as the selected simulation kernel based on said static analysis; and connecting to the selected simulation kernel with the simulation controller.

13. The method of claim 11, said executing including:

extracting model metadata from the transformed model simulation job;

initializing a current run instance indicator and a total run count indicator, where the total run count indicator represents a number of runs on a run list of the transformed model simulation job;

executing a simulation run corresponding to a current run instance;

determining a completion result based on whether the current run instance indicator is less than the total run count indicator;

responsive to a determination that the current run instance is less than the total run count indicator, incrementing the current run instance indicator and performing said executing, and determining steps, otherwise sending the simulation job output to an output module.

14. A non-transitory computer-readable medium having embodied thereon a program which, when executed by one or more processors, causes the processors to perform a method for automating parallelization kernel selection in distributed simulations, comprising:

receiving data representing a model simulation job;

converting the received data into a format suitable for processing;

first performing simulation runs of the model simulation job with an external parallelization kernel;

determining whether all simulation runs in the model simulation job successfully completed on the external kernel;

second performing simulation runs of the model simulation job with an internal kernel responsive to a determination that not all simulation runs in the model simulation job successfully completed on the external kernel;

generating model output data representing results of all simulation runs in the model; and selecting the external kernel or the internal kernel based on the model output data.

15. The medium of claim 14, said converting comprising:
converting the model simulation job into a transformed simulation job, said transformed simulation job having a data format suitable for processing by the external and internal kernels; and
forwarding the transformed simulation job to a simulation controller.

16. The medium of claim 15, the method further comprising:
connecting the simulation controller to the external parallelization kernel via a kernel socket;
sending the transformed simulation job to the external kernel after said connecting;
disconnecting the simulation controller from said external parallelization kernel after said determining; and
outputting the model output data.

17. The medium of claim 14, where said first performing includes:
extracting model metadata from the model simulation job;
initializing a failed run count counter, a current run instance indicator, and a total run count indicator;
executing an external simulation run corresponding to a current run instance;
determining an execution result, based on whether a result of said executing was successful;
responsive to a determination that a result of said executing was successful, providing a result of said executing as simulation run output, otherwise adding information about said simulation run to a failed run list and incrementing the failed run count counter;
determining a completion result based on whether the current run instance indicator is less than the total run count indicator;
responsive to a determination that the current run instance is less than the total run count indicator, incrementing the current run instance indicator and performing said executing, determining, and determining steps, otherwise sending the simulation job output to an output module.

18. The medium of claim 17, said determining whether all simulation runs in the model simulation job successfully completed on the external kernel including:
responsive to a determination that the current run instance is at least equal to the total run count indicator, checking, before said sending the simulation job output to an output module, whether the failed run count counter indicates one or more failed runs; and
responsive to a determination that the failed run count counter indicates one or more failed runs, carrying out said second performing step on said failed runs instead of said sending the simulation job output to an output module;
responsive to a determination that the current run instance is less than the total run count indicator, checking, before said incrementing the current run instance indicator, whether the failed run count counter is greater than a failed run threshold; and
responsive to a determination that the failed run count counter is greater than a failed run threshold, carrying out said second performing step on said failed runs and any remaining model runs instead of said incrementing the current run instance indicator.

19. The medium of claim 14, said second performing including:
connecting to an internal simulation kernel with a simulation controller;
moving any failed or un-processed simulation runs to a failed run list;
copying the failed run list to the internal simulation kernel;
initializing a current run instance indicator, and a total run count indicator, where said total run count indicator represents a number of simulation runs in the failed run list;
executing an internal simulation run corresponding to a current run instance;
determining a completion result based on whether the current run instance indicator is less than the total run count indicator;
responsive to a determination that the current run instance is less than the total run count indicator, incrementing the current run instance indicator and performing said executing and determining steps, otherwise sending the simulation job output to an output module and disconnecting the simulation controller from the internal simulation kernel.

20. A non-transitory computer-readable medium having embodied thereon a program which, when executed by one or more processors, causes the processors to perform a method for automating parallelization kernel selection in distributed simulations, comprising:
receiving, at a model parser, a simulation model and a first simulation run list;
converting, by the model parser, the simulation model and first run list to a format consumable by a simulation kernel;
initializing a run count and a failed run count;
setting a total external run number to a number of simulation runs on the first run list;
first running the simulation model using the external simulation kernel;
first determining whether said first running resulted in a successful simulation run;
responsive to a first determining indicating a successful run, passing an output of said first running to the output module; and
responsive to a first determining indicating an unsuccessful run, updating a second run list with parameters from said first running and incrementing the failed run count;
second determining, whether the run count is less than the total external run number;
responsive to a second determining indicating that the run count is not less than the total external run number, unloading the external simulation kernel, the converted simulation model, and the converted first run list; and
responsive to a second determining indicating that the run count is less than the total external run number third determining, whether the failed run count is less than a failure threshold;
responsive to a third determining indicating that the failed run count is less than the failure threshold, incrementing the run count and performing said first running; first determining, and second determining steps; and
responsive to a third determining indicating that the failed run count is not less than the failure threshold, halting the external simulation kernel and loading an internal simulation kernel;
updating the second run list with parameters from any not-yet-run simulation runs;
re-initializing the run count;

setting a total internal run number to a number of simulation runs on the second run list;
second running the simulation model using the internal simulation kernel;
passing an output of said second running to the output module;
fourth determining whether the run count is less than the total internal run number;
responsive to a fourth determining indicating that the run count is not less than the total internal run number, unloading the internal simulation kernel, the converted simulation model, and the second run list; and
responsive to a fourth determining indicating that the run count is less than the total internal run number, incrementing the run count and performing said second running, passing, and fourth determining steps;
generating model output data representing results of all simulation runs in the model simulation job; and
selecting the external kernel or the internal kernel based on the model output data.

* * * * *